United States Patent
Hsu et al.

(10) Patent No.: US 10,158,352 B2
(45) Date of Patent: Dec. 18, 2018

(54) DELAY SIGNAL GENERATING APPARATUS USING GLITCH FREE DIGITALLY CONTROLLED DELAY LINE AND ASSOCIATED DELAY SIGNAL GENERATING METHOD

(71) Applicant: MEDIATEK INC., Hsin-Chu (TW)

(72) Inventors: Ying-Yu Hsu, Hsinchu (TW);
Chih-Lun Chuang, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 25 days.

(21) Appl. No.: 15/404,166

(22) Filed: Jan. 11, 2017

(65) Prior Publication Data
US 2018/0198439 A1    Jul. 12, 2018

(51) Int. Cl.
H03H 11/26 (2006.01)
H03K 5/133 (2014.01)
H03K 5/131 (2014.01)
H03K 5/00 (2006.01)

(52) U.S. Cl.
CPC .......... *H03K 5/133* (2013.01); *H03K 5/131* (2013.01); *H03K 2005/00052* (2013.01); *H03K 2005/00058* (2013.01)

(58) Field of Classification Search
None
See application file for complete search history.

(56) References Cited

U.S. PATENT DOCUMENTS

| | | | | |
|---|---|---|---|---|
| 6,958,634 B2* | 10/2005 | Rashid | .................. | H03K 5/133 327/141 |
| 7,629,819 B2* | 12/2009 | Kwak | .................. | G11C 7/1072 327/158 |
| 9,628,092 B2* | 4/2017 | Francom | ............... | H03L 7/0812 |
| 2008/0272814 A1* | 11/2008 | Chiang | .................. | H03K 3/017 327/175 |
| 2010/0182058 A1* | 7/2010 | Gomm | .................. | H03L 7/0814 327/158 |
| 2010/0315145 A1* | 12/2010 | Chee | .................. | H03K 5/15066 327/258 |
| 2015/0188527 A1* | 7/2015 | Francom | .................. | H03K 5/14 327/158 |
| 2015/0341021 A1* | 11/2015 | Ma | ........................ | H03K 3/017 327/175 |

* cited by examiner

*Primary Examiner* — Lincoln Donovan
*Assistant Examiner* — Khareem E Almo
(74) *Attorney, Agent, or Firm* — Winston Hsu

(57) ABSTRACT

A delay signal generating apparatus has a digitally controlled delay line and a control circuit. The digitally controlled delay line has a coarse delay circuit and a fine delay circuit. The coarse delay circuit generates a plurality of coarse delay signals by applying a plurality of different coarse delay amounts to an input signal, respectively, wherein the different coarse delay amounts are set by a first control input. The fine delay circuit generates a fine delay signal having a fine delay amount with respect to the input signal by performing phase interpolation based on the coarse delay signals, wherein the fine delay amount is set by a second control input. The control circuit generates the first control input to the coarse delay circuit, and generates the second control input to the fine delay circuit, wherein the control circuit does not change the first control input unless one of the coarse delay signals has no contribution to the fine delay signal according to the second control input.

20 Claims, 12 Drawing Sheets

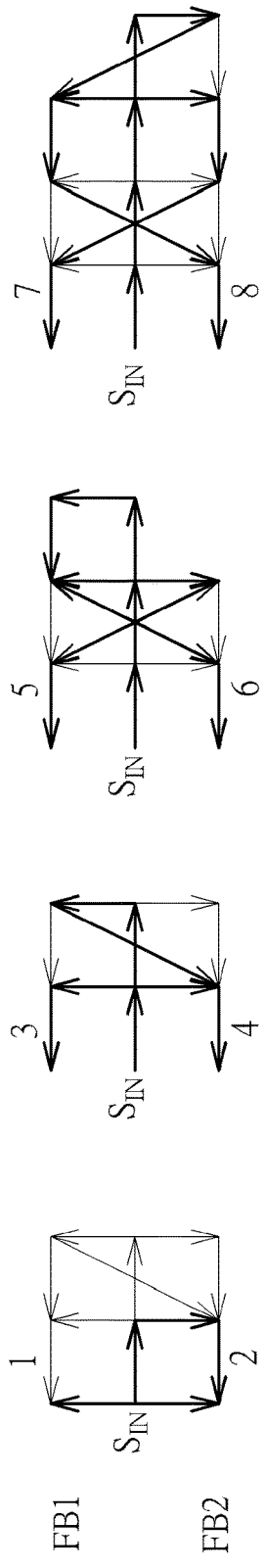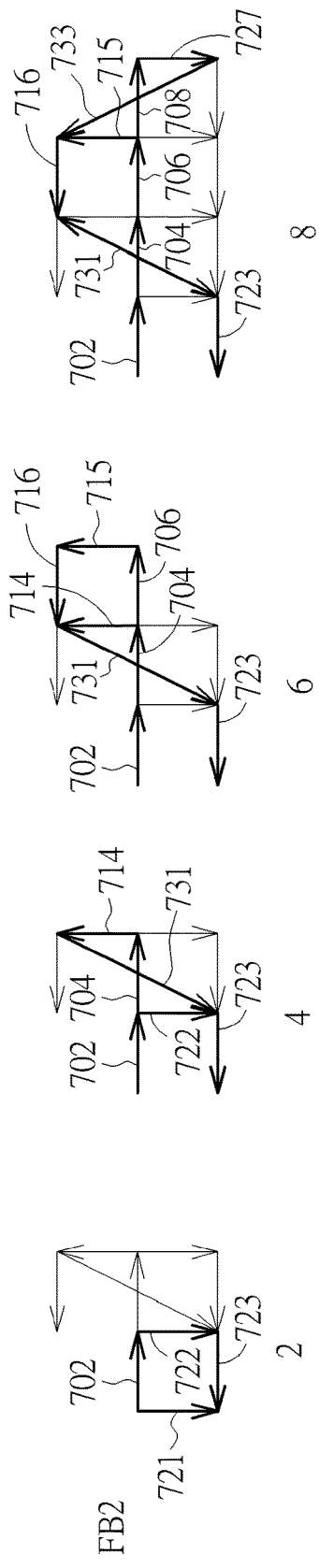
FIG. 7A  FIG. 7B  FIG. 7C  FIG. 7D

DELAY SIGNAL GENERATING APPARATUS USING GLITCH FREE DIGITALLY CONTROLLED DELAY LINE AND ASSOCIATED DELAY SIGNAL GENERATING METHOD

BACKGROUND

The present invention relates to applying a delay amount to an input signal to generate a delay signal, and more particularly, to a delay signal generating apparatus using a glitch free digitally controlled delay line and an associated delay signal generating method.

From a practical point of view, the digitally controlled delay line (DCDL) plays an important role in many applications such as all-digital phase locked loop (ADPLL), delay-locked loop (DLL), phase shifter, clock generator, etc. However, glitch is an unwanted pulse which occurs in a digital circuit, and becomes the most common design problem in the digital circuit. For example, the unwanted glitch may lead to loss of data. With regard to a typical DCDL, it may have glitch under the presence of a delay control code switching. Thus, there is a need for an innovative DCDL design which is glitch free.

SUMMARY

One of the objectives of the claimed invention is to provide a delay signal generating apparatus using a glitch free digitally controlled delay line and an associated delay signal generating method.

According to a first aspect of the present invention, an exemplary delay signal generating apparatus is disclosed. The exemplary delay signal generating apparatus includes a digitally controlled delay line and a control circuit. The digitally controlled delay line includes a coarse delay circuit and a fine delay circuit. The coarse delay circuit is arranged to generate a plurality of coarse delay signals by applying a plurality of different coarse delay amounts to an input signal, respectively, wherein the different coarse delay amounts are set by a first control input. The fine delay circuit is arranged to generate a fine delay signal having a fine delay amount with respect to the input signal by performing phase interpolation based on the coarse delay signals, wherein the fine delay amount is set by a second control input. The control circuit is arranged to generate the first control input to the coarse delay circuit and generate the second control input to the fine delay circuit, wherein the control circuit does not change the first control input unless one of the coarse delay signals has no contribution to the fine delay signal according to the second control input.

According to a second aspect of the present invention, an exemplary delay signal generating method is disclosed. The exemplary delay signal generating method includes: generating a first control input; generating a second control input; generating a plurality of coarse delay signals by applying a plurality of different coarse delay amounts to an input signal, respectively, wherein the different coarse delay amounts are digitally controlled by the first control input; and generating a fine delay signal with a fine delay amount by performing phase interpolation based on the coarse delay signals, wherein the fine delay amount is digitally controlled by the second control input. The first control input is not changed unless one of the coarse delay signals has no contribution to the fine delay signal according to the second control input.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7A-FIG. 7D are diagrams illustrating a second example of configuring a digitally controlled delay line with common delay elements for generating coarse delay signals according to an embodiment of the present invention.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
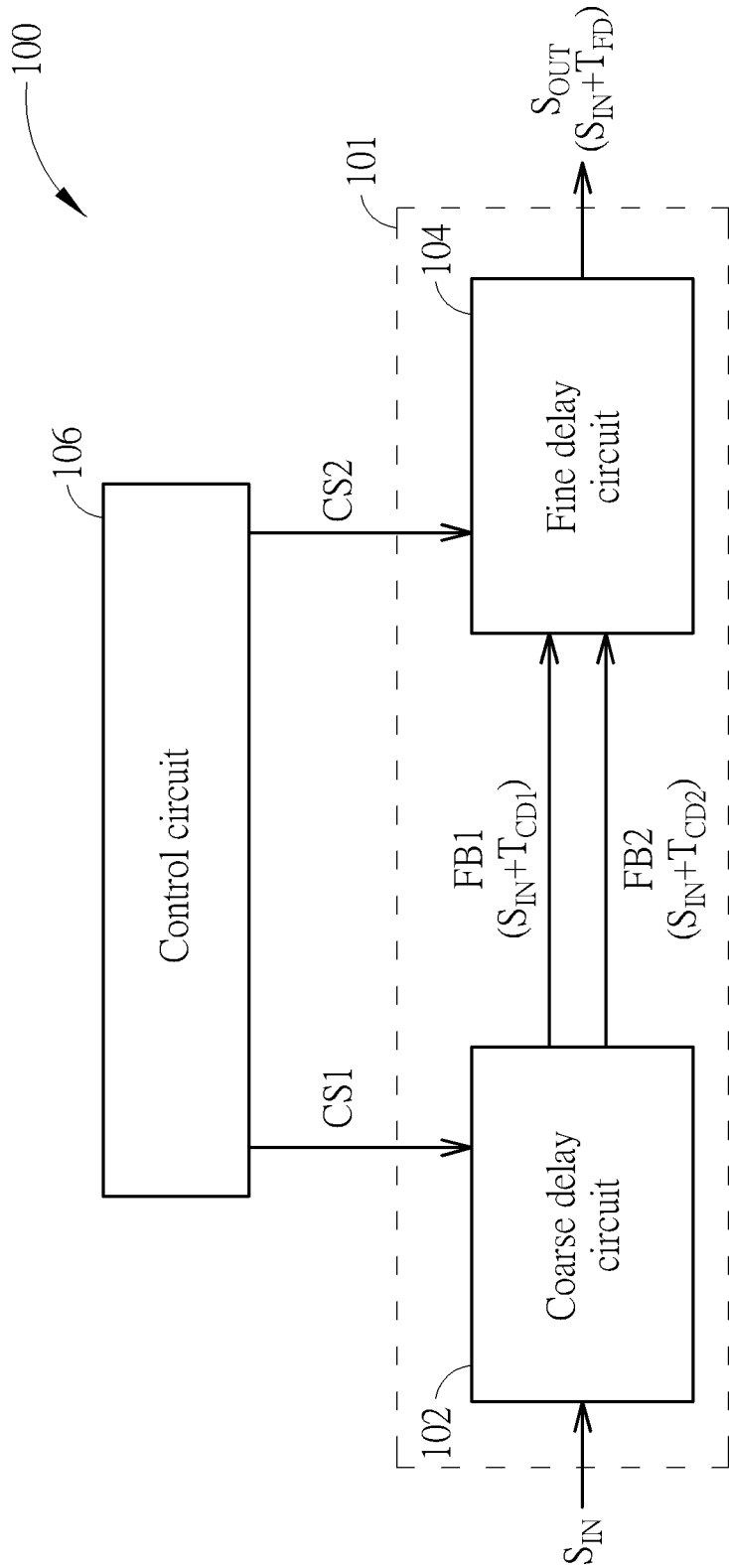
FIG. 1 is a block diagram illustrating a delay signal generating apparatus according to an embodiment of the present invention.

FIG. 1 is a block diagram illustrating a delay signal generating apparatus 100 according to an embodiment of the present invention. The delay signal generating apparatus 100 includes a glitch free digitally controlled delay line (DCDL) 101 having a coarse delay circuit 102 and a fine delay circuit 104, and further includes a control circuit 106. The control circuit 106 is arranged to manage a final delay amount between an input signal and an output signal of the glitch free DCDL 101. In this embodiment, the control circuit 106 generates a first control input CS1 to the coarse delay circuit 102, and generates a second control input CS2 to the fine delay circuit 104.

Figure 2:
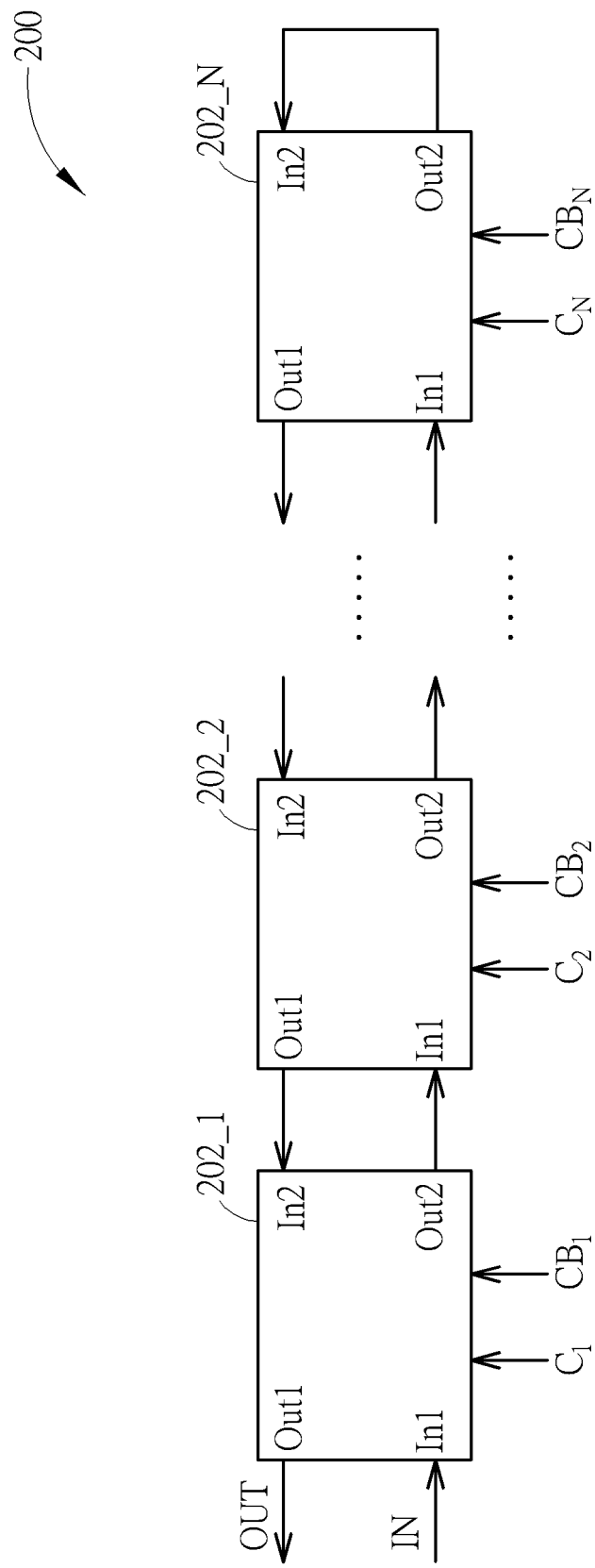
FIG. 2 is a diagram illustrating an independent digitally controlled delay line used for generating one of coarse delay signals according to an embodiment of the present invention.

The coarse delay circuit 102 is arranged to generate a plurality of coarse delay signals (e.g., FB1 and FB2) by applying a plurality of different coarse delay amounts (e.g., $T_{CD1}$ and $T_{CD2}$) to an input signal $S_{IN}$, respectively, wherein the different coarse delay amounts are set (i.e., digitally controlled) by the first control input CS1. In one exemplary design, the coarse delay circuit 102 may be configured to have a plurality of independent DCDLs for generating the coarse delay signals (e.g., FB1 and FB2), respectively. FIG. 2 is a diagram illustrating an independent DCDL used for generating one of the coarse delay signals (e.g., FB1 and FB2) according to an embodiment of the present invention. The independent DCDL 200 receives an input signal IN, and generates an output signal OUT by applying a selected delay amount to the input signal IN. As shown in FIG. 2, the independent DCDL 200 is built by a plurality of delay cells 202_1, 202_2, ..., 202_N. Each of the delay cells 202_1-202_N has a first input node In1, a second input node In2, a first output node Out1, and a second output node Out2. With regard to the leading delay cell 202_1, the first input node In1 receives the input signal IN of the independent DCDL 200, the first output node Out1 outputs the output signal OUT of the independent DCDL 200, the second output node Out2 is connected to the first input node In2 of the next delay cell 202_2, and the second input node In2 is connected to the first output node Out1 of the next delay cell 202_2. With regard to the last delay cell 202_N, the first input node In1 is connected to a second output node of a previous delay cell (not shown), the first output node Out1 is connected to a second input node of the previous delay cell (not shown), and the second input node In2 is connected to the second output node Out2. The independent DCDL 200 is controlled by the first control input CS1 that may have a plurality of control bits $C_1$, $CB_1$, $C_2$, $CB_2$, ..., $C_N$, $CB_N$, where $CB_i$ is an inverse version of $C_i$. Specifically, the delay cell 202_1 may be controlled by control bits $C_1$ and $CB_1$, the delay cell 202_2 may be controlled by control bits $C_2$ and $CB_2$, and the delay cell 202_N may be controlled by control bits $C_N$ and $CB_N$.

Figure 3:
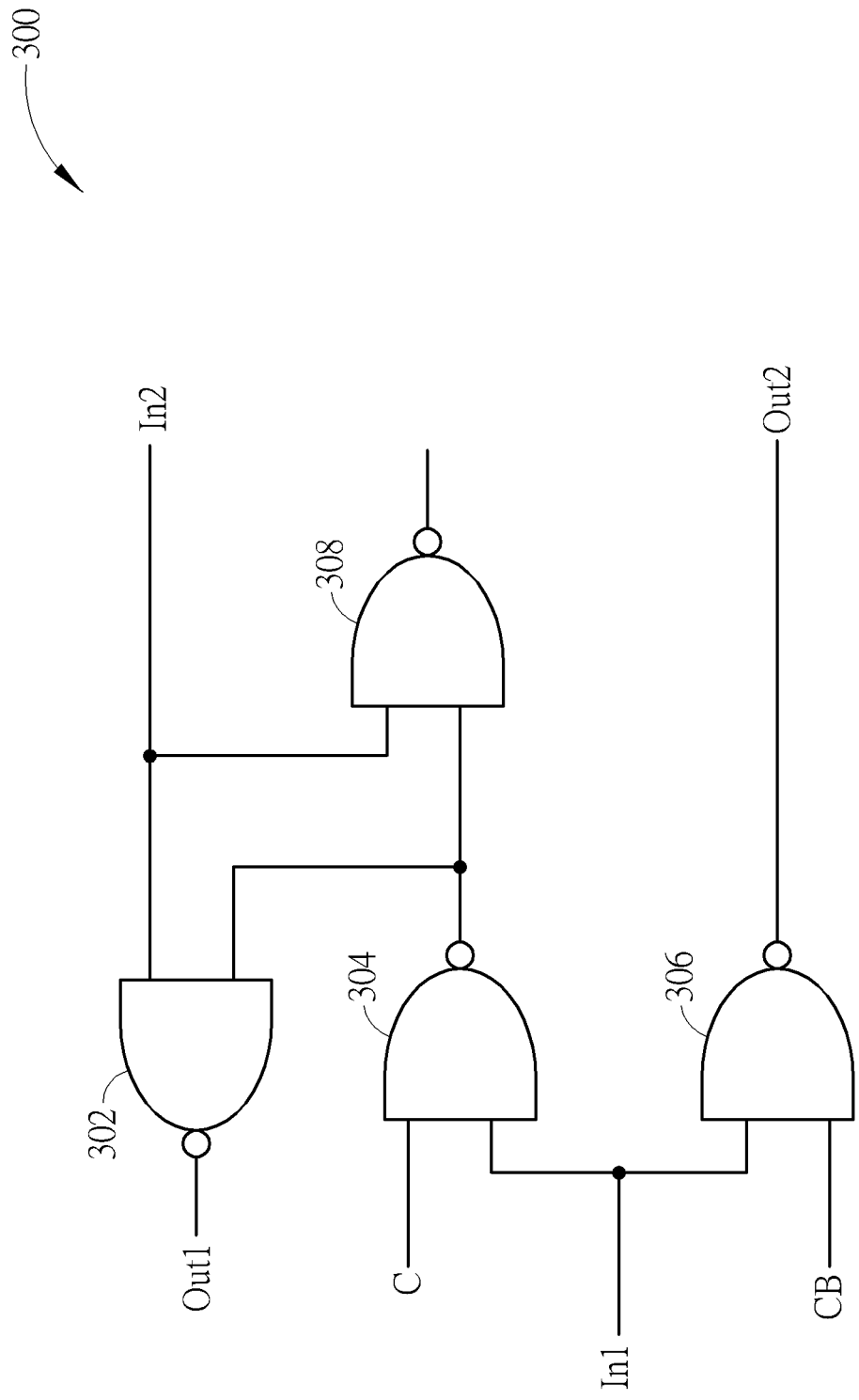
FIG. 3 is a diagram illustrating a delay cell according to an embodiment of the present invention.

For example, control bits $C_i$ and $CB_i$ of a delay cell 202_i (1≤i≤N) determine if an input signal received at the first input node In1 is delayed and then transmit to the first output node Out1, or an input signal received at the first input node In1 is delayed and then transmit to the second output node Out2 and another input signal received at the second input node In2 is delayed and then transmit to the first output node Out1. FIG. 3 is a diagram illustrating a delay cell according to an embodiment of the present invention. Each of the delay cells 202_1-202_N may be implemented using the delay cell 300 shown in FIG. 3. The delay cell 300 includes a plurality of NAND gates 302, 304, 306, 308, where the NAND gate 308 is a dummy logic gate for load balancing. In a case where (C, CB) is set by (1, 0), an input signal received at the first input node In1 is delayed by NAND gates 304 and 302 and then transmitted to the first output node Out1. If the current delay cell is the leading delay cell 202_1, the input signal received at the first input node In1 is delayed by the leading delay cell 202_1 internally. If the current delay cell is not the leading delay cell 202_1, the input signal received at the first input node In1 is delayed by the current delay cell and then delayed by one or more previous delay cells.

In another case where (C, CB) is set by (0, 1), an input signal received at the first input node In1 is delayed by NAND gate 306 and then transmitted to the second output node Out2, and another input signal received at the second input node In2 is delayed by NAND gate 302 and then transmitted to the first output node Out1. If the current delay cell is the last delay cell 202_N, the input signal received at the first input node In1 is delayed by the NAND gates 306 and 302 of the delay cell 300 and then delayed by one or more previous delay cells. If the current delay cell is the leading delay cell 202_1, the input signal received at the first input node In1 is delayed by the delay cell 300 and is further delayed by a next delay cell, and the input signal received at the second input node In2 is delayed by the delay cell 300 and is not further delayed by a previous delay cell. If the current delay cell is neither the leading delay cell (e.g., 202_1) nor the last delay cell (e.g., 202_N), the input signal received at the first input node In1 is delayed by the current delay cell and then delayed by one or more next delay cells, and the input signal received at the second input node In2 is delayed by the current delay cell and then delayed by one or more previous delay cells.

With a proper setting of the first control input CS1, one independent DCDL 200 can be configured to generate the coarse delay signal FB1 having the coarse delay amount $T_{CD1}$ with respect to the input signal $S_{IN}$, and another independent DCDL 200 can be configured to generate the coarse delay signal FB2 having the coarse delay amount $T_{CD2}$ with respect to the input signal $S_{IN}$. However, using independent DCDLs for generating multiple coarse delay signals (e.g., FB1 and FB2) to the fine delay circuit 104 is merely one feasible implementation of the coarse delay circuit 102. In practice, the coarse delay circuit 102 may be implemented using a different circuit design. For example, in another exemplary design, the coarse delay circuit 102 may be implemented by merging a plurality of independent DCDL circuits for generating the coarse delay signals (e.g., FB1 and FB2) by using common delay elements.

Figure 4:
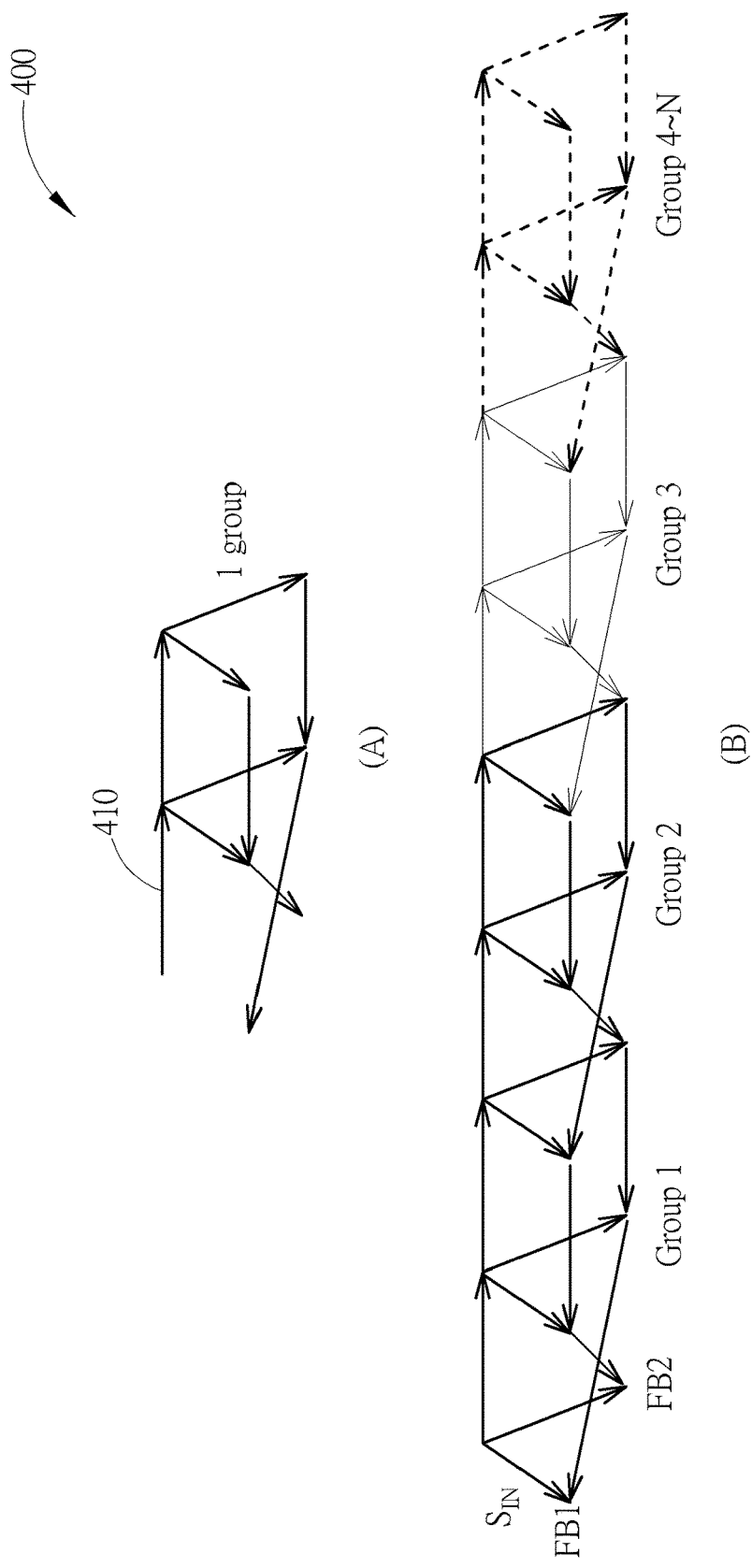
FIG. 4 is a diagram illustrating a first digitally controlled delay line with common delay elements for generating coarse delay signals according to an embodiment of the present invention.

FIG. 4 is a diagram illustrating a first DCDL with common delay elements for generating coarse delay signals (e.g., FB1 and FB2) according to an embodiment of the present invention. The sub-diagram (A) of FIG. 4 shows one delay element group of the DCDL 400. One delay element group may include a plurality of delay elements 410, each arranged to apply one unit coarse delay to a signal passing therethrough. For example, the delay elements 410 may be implemented using NAND gates that are selectively enabled by respective control bits, as illustrated in FIG. 3. The sub-diagram (B) of FIG. 4 shows that the DCDL 400 is built by a plurality of delay element groups Group 1-Group N. With a proper selection of delay elements, a delay path can be established for delaying the input signal $S_{IN}$ to generate a coarse delay signal. As can be seen from FIG. 4, a delay path established for delaying the input signal $S_{IN}$ to generate the coarse delay signal FB1 and a delay path established for delaying the input signal $S_{IN}$ to generate the coarse delay signal FB2 are allowed to use common delay element (s). In this way, the power consumption and the chip area can be greatly reduced, and the mismatch between delay paths associated with generation of different coarse delay signals can be effectively minimized.

Figure 5:
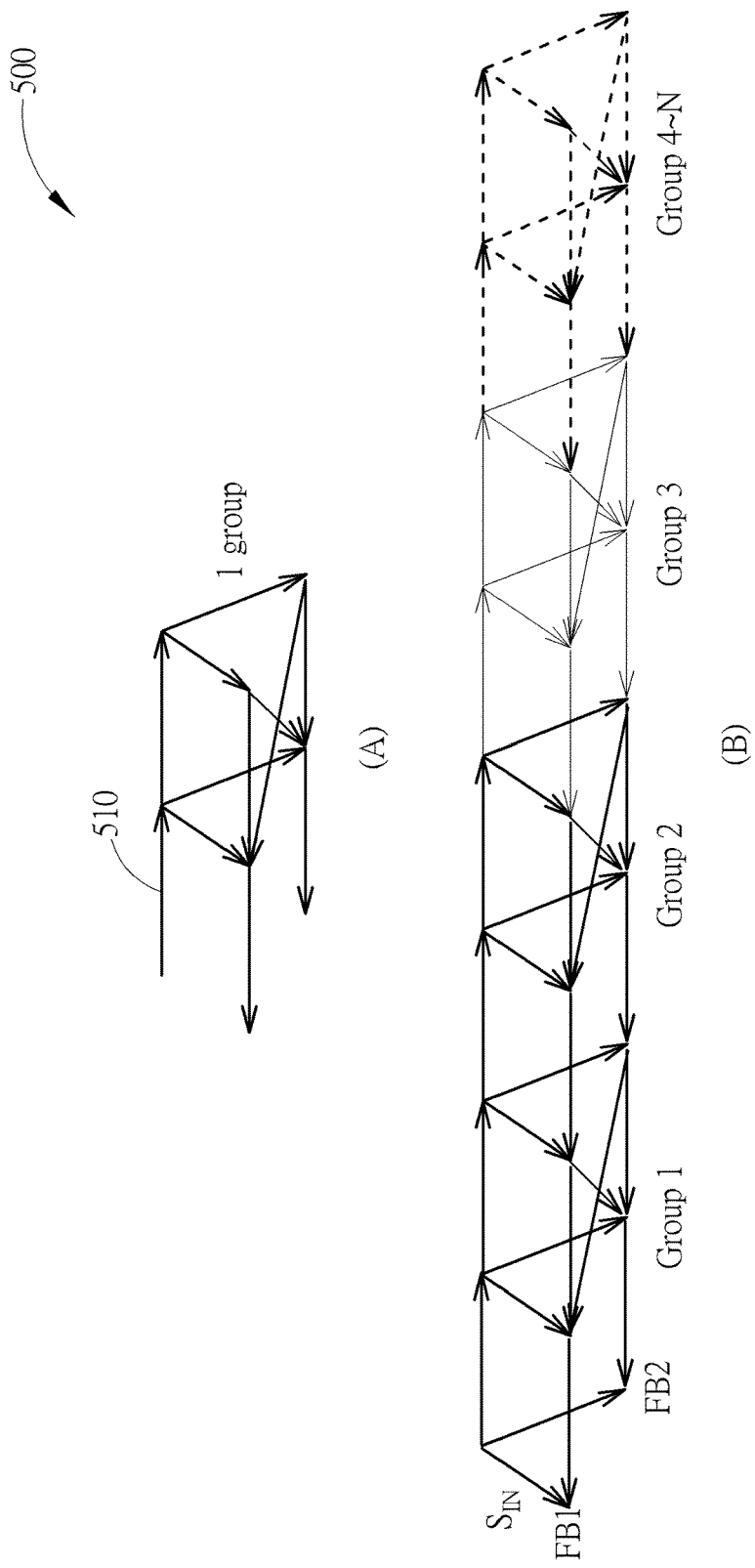
FIG. 5 is a diagram illustrating a second digitally controlled delay line with common delay elements for generating coarse delay signals according to an embodiment of the present invention.

FIG. 5 is a diagram illustrating a second DCDL with common delay elements for generating coarse delay signals (e.g., FB1 and FB2) according to an embodiment of the present invention. The sub-diagram (A) of FIG. 5 shows one delay element group of the DCDL 500. One delay element group may include a plurality of delay elements 510, each arranged to apply one unit coarse delay to a signal passing therethrough. For example, the delay elements 510 may be implemented using NAND gates that are selectively enabled by respective control bits, as illustrated in FIG. 3. The sub-diagram (B) of FIG. 5 shows the DCDL 500 is built by a plurality of delay element groups Group 1-Group N. With a proper selection of delay elements, a delay path is established for delaying the input signal $S_{IN}$ to generate a coarse delay signal. As can be seen from FIG. 5, a delay path established for delaying the input signal $S_{IN}$ to generate the coarse delay signal FB1 and a delay path established for delaying the input signal $S_{IN}$ to generate the coarse delay signal FB2 are allowed to use common delay element(s). In this way, the power consumption and the chip area can be greatly reduced, and the mismatch between delay paths associated with generation of different coarse delay signals can be effectively minimized.

It should be noted that the coarse delay circuit structures shown in FIG. 4 and FIG. 5 are for illustrative purposes only, and are not meant to be limitations of the present invention. In practice, a different coarse delay circuit design that merges independent DCDL circuits for generating coarse delay signals (e.g., FB1 and FB2) can be used. With proper design and control of the coarse delay circuit 102, additional benefits can be achieved. For example, the mismatch between delay paths associated with generation of different coarse delay signals can be minimized by delay element interleaving, and/or the delay step can be reduced by one-time interpolation.

FIG. 6A-FIG. 6D are diagrams illustrating a first example of configuring a DCDL with common delay elements for generating coarse delay signals (e.g., FB1 and FB2) according to an embodiment of the present invention. In this example, the DCDL used for generating the coarse delay signals FB1 and FB2 has common delay elements 602, 604 and 606. More specifically, when one of the common delay elements 602, 604 and 606 is involved in setting the coarse delay amount $T_{CD1}$, the same common delay element may also be involved in setting the other coarse delay amount $T_{CD2}$. Hence, the power consumption and the chip area can be greatly reduced by using common delay element(s) for generating multiple coarse delay signals. In addition to the common delay elements 602, 604 and 606, the DCDL used for generating the coarse delay signals FB1 and FB2 further includes a first group of delay elements 611, 612, 613, 614, and 615 located on a first side of the common delay elements 602-606, a second group of delay elements 621, 622, 623, 624, 625, 626 located on a second side of the common delay elements 602-606, and a third group of delay elements 631, 632, 633 and 634.

Figures 6A, 6B, 6C, 6D:
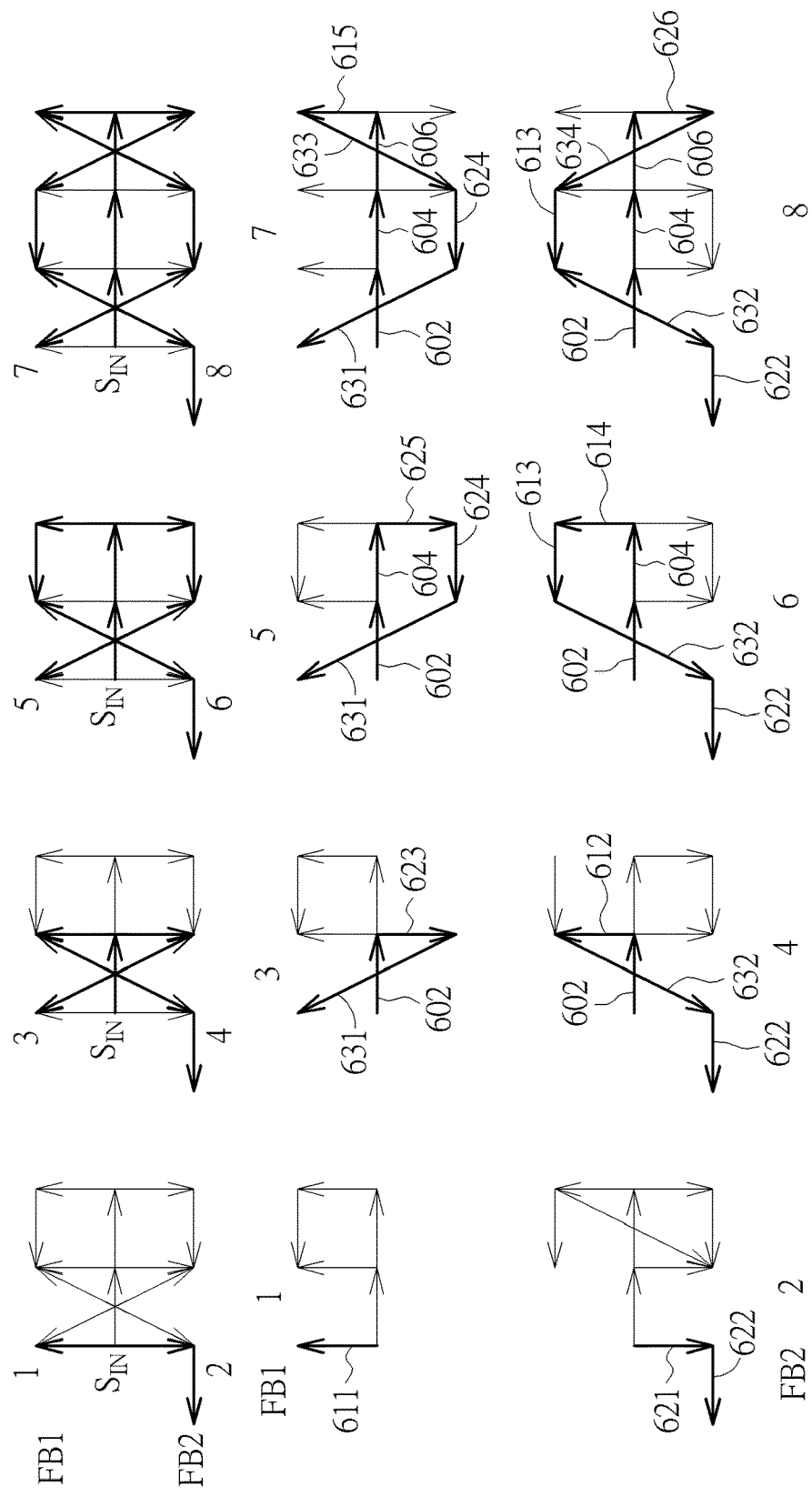
FIG. 6A-FIG. 6D are diagrams illustrating a first example of configuring a digitally controlled delay line with common delay elements for generating coarse delay signals according to an embodiment of the present invention.

When the first control input CS1 has a first setting, the DCDL with common delay elements may be configured to generate a coarse delay signal FB1 with one unit coarse delay (which is provided by the delay element 611) with respect to the input signal $S_{IN}$ and a coarse delay signal FB2 with two unit coarse delays (which are provided by delay elements 621 and 622) with respect to the input signal $S_{IN}$, as illustrated in FIG. 6A.

When the first control input CS1 has a second setting, the DCDL with common delay elements may be configured to generate the coarse delay signal FB1 with three unit coarse delays (which are provided by delay elements 602, 623 and 631) with respect to the input signal $S_{IN}$ and the coarse delay signal FB2 with four unit coarse delays (which are provided by 602, 612, 632 and 622) with respect to the input signal $S_{IN}$, as illustrated in FIG. 6B.

When the first control input CS1 has a third setting, the DCDL with common delay elements may be configured to generate the coarse delay signal FB1 with five unit coarse delays (which are provided by delay elements 602, 604, 625, 624 and 631) with respect to the input signal $S_{IN}$ and the coarse delay signal FB2 with six unit coarse delays (which are provided by 602, 604, 614, 613, 632 and 622) with respect to the input signal $S_{IN}$, as illustrated in FIG. 6C.

When the first control input CS1 has a fourth setting, the DCDL with common delay elements may be configured to generate the coarse delay signal FB1 with seven unit coarse delays (which are provided by delay elements 602, 604, 606, 615, 633, 624 and 631) with respect to the input signal $S_{IN}$ and the coarse delay signal FB2 with eight unit coarse delays (which are provided by 602, 604, 606, 626, 634, 613, 632 and 622) with respect to the input signal $S_{IN}$, as illustrated in FIG. 6D.

Suppose that one unit coarse delay provided by each of the delay elements 611-615 located on the first side of the common delay elements 602-606 is deviated from an expected value. If the coarse delay signal FB1 is generated by delaying the input signal $S_{IN}$ with delay element (s) selected from the first group of delay elements 611-615 only, the errors are accumulated, resulting in a large mismatch between a delay path associated with generation of the coarse delay signal FB1 and a delay path associated with generation of the coarse delay signal FB2. Similarly, suppose that one unit coarse delay provided by each of the delay elements 621-626 located on the second side of the common delay elements 602-606 is deviated from an expected value. If the coarse delay signal FB2 is generated by delaying the input signal $S_{IN}$ with delay element(s) selected from the second group of delay elements 621-626 only, the errors are accumulated, resulting in a large mismatch between a delay path associated with generation of the coarse delay signal FB2 and a delay path associated with generation of the coarse delay signal FB1.

To minimize the path mismatch, the present invention therefore proposes using a delay element interleaving technique. As shown in FIG. 6A, the delay element 611 selected from the first group of delay elements 611-615 is involved in setting the coarse delay amount $T_{CD1}$ applied to the input signal $S_{IN}$, and the delay elements 621 and 622 selected from the second group of delay elements 621-626 are involved in setting the coarse delay amount $T_{CD2}$ applied to the input signal $S_{IN}$. However, as shown in FIG. 6B, the delay element 623 selected from the second group of delay elements 621-626 is involved in setting the coarse delay amount $T_{CD1}$ applied to the input signal $S_{IN}$, and the delay element 612 selected from the first group of delay elements 611-615 is involved in setting the coarse delay amount $T_{CD2}$ applied to the input signal $S_{IN}$. In this way, the mismatch between a delay path associated with generation of the coarse delay signal FB2 and a delay path associated with generation of the coarse delay signal FB1 can be averaged/minimized by delay element interleaving.

As shown in FIG. 6C, the delay elements 624 and 625 selected from the second group of delay elements 621-626 are involved in setting the coarse delay amount $T_{CD1}$ applied to the input signal $S_{IN}$, and the delay elements 613 and 614 selected from the first group of delay elements 611-615 are involved in setting the coarse delay amount $T_{CD2}$ applied to the input signal $S_{IN}$. However, as shown in FIG. 6D, the delay element 615 selected from the first group of delay elements 611-615 is involved in setting the coarse delay amount $T_{CD1}$ applied to the input signal $S_{IN}$, and the delay element 626 selected from the second group of delay elements 621-626 is involved in setting the coarse delay amount $T_{CD2}$ applied to the input signal $S_{IN}$. Similarly, the mismatch between a delay path associated with generation of the coarse delay signal FB2 and a delay path associated with generation of the coarse delay signal FB1 can be averaged/minimized by delay element interleaving.

It should be noted that the configurations shown in FIG. 6A-FIG. 6D are for illustrative purposes only, and are not meant to be limitations of the present invention. In practice, the first control input CS1 can be properly adjusted to make the coarse delay signal FB1 has any number of unit coarse delays and also make the coarse delay signal FB2 has any number of unit coarse delays. For example, the first control input CS1 can be set to configure one of the coarse delay amounts $T_{CD1}$ and $T_{CD2}$ by M unit coarse delays and configure the other of the coarse delay amounts $T_{CD1}$ and $T_{CD2}$ by (M+1) unit coarse delays, where M may be any positive value supported by the exemplary DCDL design shown in FIG. 6A-FIG. 6D.

FIG. 7A-FIG. 7D are diagrams illustrating a second example of configuring a DCDL with common delay elements for generating coarse delay signals (e.g., FB1 and FB2) according to an embodiment of the present invention. In this example, the DCDL used for generating the coarse delay signals FB1 and FB2 has common delay elements 702, 704, 706 and 708. More specifically, when one of the common delay elements 702-708 is involved in setting the coarse delay amount $T_{CD1}$, the same common delay element may also be involved in setting the other coarse delay amount $T_{CD2}$. Hence, the power consumption and the chip area can be greatly reduced by using common delay element (s) for generating multiple coarse delay signals. In addition to the common delay elements 702-708, the DCDL used for generating the coarse delay signals FB1 and FB2 further includes a first group of delay elements 711, 712, 713, 714, 715 and 716 located on a first side of the common delay elements 702-708, a second group of delay elements 721, 722, 723, 724, 725, 726, 727 located on a second side of the common delay elements 702-708, and a third group of delay elements 731, 732, and 733.

When the first control input CS1 has a first setting, a DCDL with common delay elements may be configured to generate a coarse delay signal FB1 with one unit coarse delay (which is provided by the delay element 711) with respect to the input signal $S_{IN}$ and a coarse delay signal FB2 with two unit coarse delays (which are generated by one-time interpolation of one unit coarse delay provided by delay elements 721 and three unit coarse delays provided by delay elements 702, 722 and 723) with respect to the input signal $S_{IN}$, as illustrated in FIG. 7A. It should be noted that the coarse delay signal FB2 is generated by combining delay signals obtained from passing the input signal $S_{IN}$ through different delay paths, one composed of the delay element 721 and the other composed of delay elements 702, 722 and 723. Due to inherent characteristics of signal combination, the coarse delay amount $T_{CD2}$ results from interpolation of different delay amounts provided by delay elements located at different delay paths.

When the first control input CS1 has a second setting, the DCDL with common delay elements may be configured to generate the coarse delay signal FB1 with three unit coarse delays (which are provided by delay elements 702, 712 and 713) with respect to the input signal $S_{IN}$ and the coarse delay signal FB2 with four unit coarse delays (which are generated by one-time interpolation of three unit coarse delays provided by delay elements 702, 722 and 723 and five unit coarse delays provided by delay elements 702, 704, 714, 731 and 723) with respect to the input signal $S_{IN}$, as illustrated in FIG. 7B.

When the first control input CS1 has a third setting, the DCDL with common delay elements may be configured to generate the coarse delay signal FB1 with five unit coarse delays (which are provided by delay elements 702, 704, 724, 732 and 713) with respect to the input signal $S_{IN}$ and the coarse delay signal FB2 with six unit coarse delays (which are generated by one-time interpolation of five unit coarse delays provided by delay elements 702, 704, 714, 731 and 723 and seven unit coarse delays provided by delay elements 702, 704, 706, 715, 716, 731 and 723) with respect to the input signal $S_{IN}$, as illustrated in FIG. 7C.

When the first control input CS1 has a fourth setting, the DCDL with common delay elements may be configured to generate the coarse delay signal FB1 with seven unit coarse delays (which are provided by delay elements 702, 704, 706, 725, 726, 732 and 713) with respect to the input signal $S_{IN}$ and the coarse delay signal FB2 with eight unit coarse delays (which are generated by one-time interpolation of seven unit coarse delays provided by delay elements 702, 704, 706, 715, 716, 731 and 723 and nine unit coarse delays provided by delay elements 702, 704, 706, 708, 727, 733, 716, 731 and 723) with respect to the input signal $S_{IN}$, as illustrated in FIG. 7D.

Like the example shown in FIG. 6A-FIG. 6D, the example shown in FIG. 7A-FIG. 7D employs the aforementioned delay element interleaving technique to minimize the mismatch between a delay path associated with generation of the coarse delay signal FB2 and a delay path associated with generation of the coarse delay signal FB1. In addition, one-time interpolation is further employed to reduce the delay step.

It should be noted that the configurations shown in FIG. 7A-FIG. 7D are for illustrative purposes only, and are not meant to be limitations of the present invention. In practice, the first control input CS1 can be properly adjusted to make the coarse delay signal FB1 has any number of unit coarse delays and also make the coarse delay signal FB2 has any number of unit coarse delays. For example, the first control input CS1 can be set to configure one of the coarse delay amounts $T_{CD1}$ and $T_{CD2}$ by M unit coarse delays and configure the other of the coarse delay amounts $T_{CD1}$ and $T_{CD2}$ by (M+1) unit coarse delays, where M may be any positive value supported by the exemplary DCDL design shown in FIG. 7A-FIG. 7D.

As mentioned above, the coarse delay circuit 102 is responsible for generating multiple coarse delay signals (e.g., FB1 and FB2) to the fine delay circuit 104 for further processing. In this embodiment, the fine delay circuit 104 is arranged to generate a fine delay signal $S_{OUT}$ having a fine delay amount $T_{FD}$ with respect to the input signal $S_{IN}$ by performing phase interpolation based on the coarse delay signals (e.g., FB1 and FB2), wherein the fine delay amount $T_{FD}$ is set by the second control input CS2, and the fine delay signal $S_{OUT}$ serves as the final delay signal output by the glitch free DCDL 101.

Figure 8:
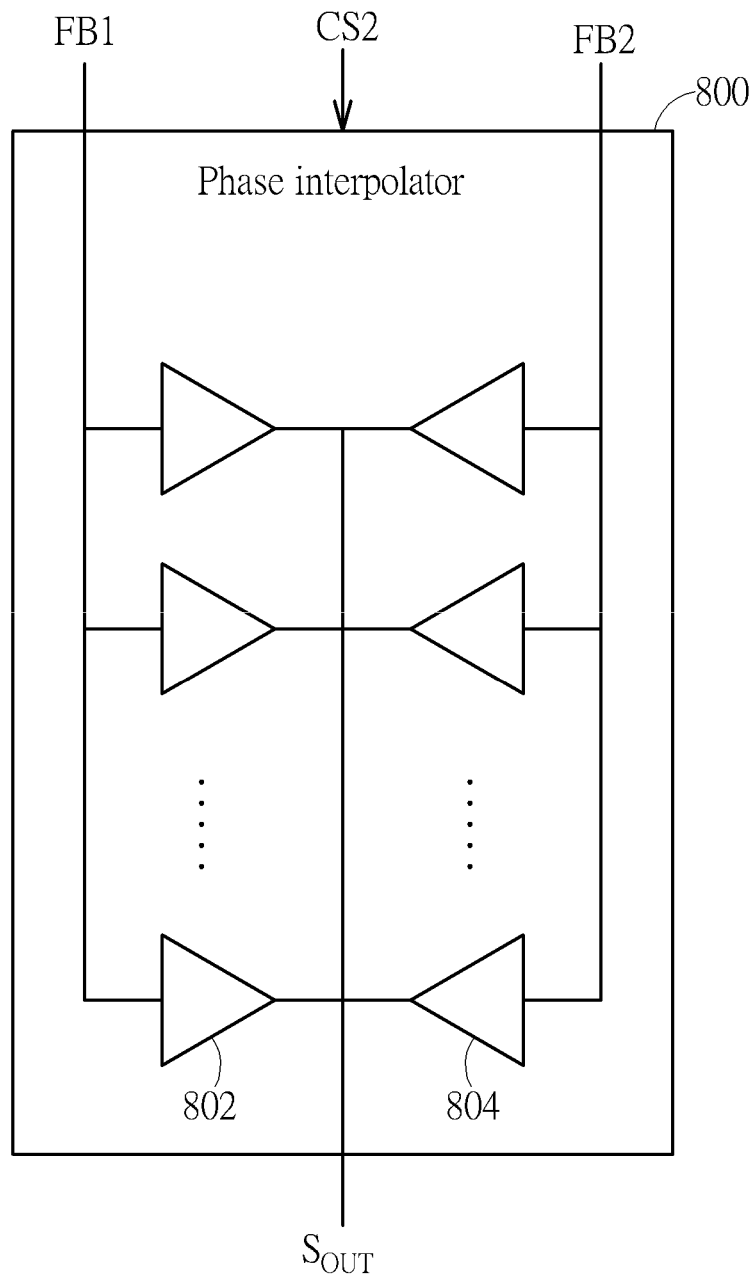
FIG. 8 is a diagram illustrating a phase interpolator according to an embodiment of the present invention.

FIG. 8 is a diagram illustrating a phase interpolator according to an embodiment of the present invention. The fine delay circuit 104 shown in FIG. 1 may be implemented using the phase interpolator 800 shown in FIG. 8. The coarse delay signals FB1 and FB2 generated from the coarse delay circuit 102 are controlled to have a delay difference between respective coarse delay amounts $T_{CD1}$ and $T_{CD2}$. For example, the delay difference between coarse delay amounts $T_{CD1}$ and $T_{CD2}$ may be one unit coarse delay. The second control input CS2 received by the phase interpolator 800 decides weighting factors A and B of the coarse delay signals FB1 and FB2. Hence, the fine delay amount $T_{FD}$ may be obtained from a weighted sum of the coarse delay amounts $T_{CD1}$ and $T_{CD2}$. For example, $T_{FD}=A \cdot T_{CD1}+B \cdot T_{CD2}+T_{PI}$, where A+B=1, and $T_{PI}$ is a constant phase interpolator delay (fine delay). In this embodiment, the second control input CS2 controls the number of buffers 802 enabled to drive the coarse delay signal FB1, and further controls the number of buffers 804 enabled to drive the coarse delay signal FB2, where a sum of the number of buffers 802 enabled to drive the coarse delay signal FB1 and the number of buffers 804 enabled to drive the coarse delay signal FB2 is equal to a fixed value. Hence, the number of buffers 802 enabled to drive the coarse delay signal FB1 decides the weighting factor A, and number of buffers 804 enabled to drive the coarse delay signal FB2 decides the weighting factor B. For example, the phase interpolator 800 has 15 buffers 802 selectively enabled for driving the coarse delay signal FB1, and also has 15 buffers 804 selectively enabled for driving the coarse delay signal FB2. The sum of the number of buffers 802 enabled to drive the coarse delay signal FB1 and the number of buffers 804 enabled to drive the coarse delay signal FB2 is equal to 15. Hence, when the number of buffers 802 enabled to drive the coarse delay signal FB1 is set by X, the number of buffers 804 enabled to drive the coarse delay signal FB2 is set by (15−X). Hence, the weighting factor A may be regarded as having a value equal to $$\frac{X}{15},$$

and the weighting factor B may be regarded as having a value equal to $$\left(1-\frac{X}{15}\right).$$

With a proper setting of the second control input CS2, the fine delay signal $S_{OUT}$ can be generated by coarse delay signals FB1 and FB2, where $T_{CD1} \le T_{FD}-T_{PI} \le T_{CD2}$ if $T_{CD1}<T_{CD2}$, or $T_{CD2} \le T_{FD}-T_{PI} \le T_{CD1}$ if $T_{CD2}<T_{CD1}$.

As mentioned above, the control circuit 106 generates the first control input CS1 to the coarse delay circuit 102, and generates the second control input CS2 to the fine delay circuit 104. To avoid glitch generated under the presence of a delay control code switching, the present invention proposes applying constraints to the timing of changing the first control input CS1. For example, the control circuit 106 does not change the first control input CS1 unless one of the coarse delay signals (e.g., FB1 and FB2) has no contribution to the fine delay signal $S_{OUT}$ according to the second control input CS2. In this embodiment, when the first control input CS1 is allowed to be changed, the control circuit 106 controls the coarse delay circuit 102 to change only one of the different coarse delay amounts (e.g., $T_{CD1}$ and $T_{CD2}$) at a time. For example, when the second control input CS2 has a setting that controls the fine delay circuit 104 to isolate a specific coarse delay signal of the different coarse delay signals (e.g., FB1 and FB2) from the fine delay signal $S_{OUT}$, only the specific delay signal is adjusted in response to the changed first control input CS1, and the rest of the different coarse delay signals (e.g., FB1 and FB2) remains unchanged. Since the specific delay signal is isolated from the fine delay signal $S_{OUT}$ and the fine delay signal $S_{OUT}$ is totally dominated by the rest of the coarse delay signals, adjusting the specific delay signal (i.e., changing the associated coarse delay amount) has no impact on the rest of the coarse delay signals as well as the fine delay signal $S_{OUT}$, thus introducing no glitch to the rest of the coarse delay signals as well as the fine delay signal $S_{OUT}$. For better understanding of the technical features, an example of changing the first control input CS1 is detailed as below.

Figure 9:
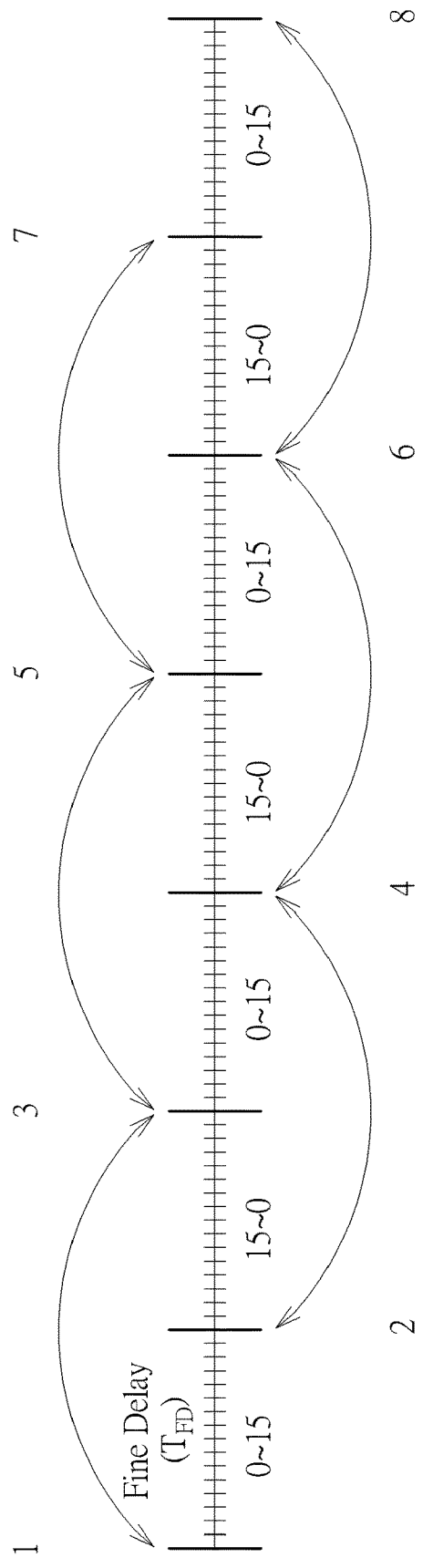
FIG. 9 is a diagram illustrating the timing of changing the first control input from a current setting to a next setting according to an embodiment of the present invention.

FIG. 9 is a diagram illustrating the timing of changing the first control input CS1 from a current setting to a next setting according to an embodiment of the present invention. As shown in FIG. 9, when the coarse delay amount $T_{CD1}$ is set by K unit coarse delays and the coarse delay amount $T_{CD2}$ is set by (K+1) unit coarse delays, the fine delay amount $T_{FD}$ is a weighted sum of K unit coarse delays and (K+1) unit coarse delays due to phase interpolation performed upon the coarse delay signals FB1 and FB2. For example, when the coarse delay amount $T_{CD1}$ is set by three unit coarse delays and the coarse delay amount $T_{CD2}$ is set by four unit coarse delays, the fine delay amount $T_{FD}$ possessed by the fine delay signal $S_{OUT}$ (which is a final delay signal of the glitch free DCDL 101) is a weighted sum of three unit coarse delays and four unit coarse delays.

When the second control input CS2 controls that the fine delay amount $T_{FD}$ is totally dominated by the coarse delay amount $T_{CD2}$ (i.e., the coarse delay signal FB1 has no contribution to the fine delay signal $S_{OUT}$ at this moment), the first control input CS1 is allowed to be adjusted for increasing or decreasing the coarse delay amount $T_{CD1}$. In a case where the coarse delay amount $T_{CD1}$ is larger than the coarse delay amount $T_{CD2}$ by a first delay difference before the first control input CS1 is changed by the control circuit 106, the coarse delay amount $T_{CD1}$ may be adjusted to become smaller than the coarse delay amount $T_{CD2}$ by a second delay difference after the first control input CS1 is changed by the control circuit 106. For example, each of the first delay difference and the second delay difference may be equal to one unit coarse delay. In another case where the coarse delay amount $T_{CD1}$ is smaller than the coarse delay amount $T_{CD2}$ by a first delay difference before the first control input CS1 is changed by the control circuit 106, the coarse delay amount $T_{CD1}$ may be adjusted to become larger than the coarse delay amount $T_{CD2}$ by a second delay difference after the first control input CS1 is changed by the control circuit 106. For example, each of the first delay difference and the second delay difference may be equal to one unit coarse delay.

For example, the coarse delay amount $T_{CD1}$ is set by three unit coarse delays, the coarse delay amount $T_{CD2}$ is set by four unit coarse delays, and a target delay amount for setting the fine delay signal $S_{OUT}$ is larger than three unit coarse delays. Hence, the control circuit 106 adjusts the second control input CS2 to reduce the weighting of the coarse delay signal FB1. When the second control input CS2 controls that the fine delay amount TD is totally dominated by the coarse delay amount $T_{CD2}$ (i.e., the coarse delay signal FB1 has no contribution to the fine delay signal $S_{OUT}$ at this moment), the control circuit 106 adjusts the first control input CS1 so as to increase the coarse delay amount $T_{CD1}$ (which has no impact on the fine delay amount TD at this moment) without changing the coarse delay amount $T_{CD2}$ (which totally dominates the fine delay amount TD at this moment). In accordance with adjustment made to the first control input CS1, the coarse delay amount $T_{CD2}$ is maintained at four unit coarse delays, while the coarse delay amount $T_{CD1}$ is changed from three unit coarse delays to five unit coarse delays.

When the second control input CS2 controls that the fine delay amount $T_{FD}$ is totally dominated by the coarse delay amount $T_{CD1}$ (i.e., the coarse delay signal FB2 has no contribution to the fine delay signal $S_{OUT}$ at this moment), the first control input CS1 is allowed to be adjusted for increasing or decreasing the coarse delay amount $T_{CD2}$. In a case where the coarse delay amount $T_{CD2}$ is larger than the coarse delay amount $T_{CD1}$ by a first delay difference before the first control input CS1 is changed by the control circuit 106, the coarse delay amount $T_{CD2}$ may be adjusted to become smaller than the coarse delay amount $T_{CD1}$ by a second delay difference after the first control input CS1 is changed by the control circuit 106. For example, each of the first delay difference and the second delay difference may be equal to one unit coarse delay. In another case where the coarse delay amount $T_{CD2}$ is smaller than the coarse delay amount $T_{CD1}$ by a first delay difference before the first control input CS1 is changed by the control circuit 106, the coarse delay amount $T_{CD2}$ may be adjusted to become larger than the coarse delay amount $T_{CD1}$ by a second delay difference after the first control input CS1 is changed by the control circuit 106. For example, each of the first delay difference and the second delay difference may be equal to one unit coarse delay.

For example, the coarse delay amount $T_{CD1}$ is set by three unit coarse delays, the coarse delay amount $T_{CD2}$ is set by four unit coarse delays, and a target delay amount for setting the fine delay signal $S_{OUT}$ is smaller than three unit coarse delays. Hence, the control circuit 106 adjusts the second control input CS2 to reduce the weighting of the coarse delay signal FB2. When the second control input CS2 controls that the fine delay amount $T_{FD}$ is totally dominated by the coarse delay amount $T_{CD1}$ (i.e., the coarse delay signal FB2 has no contribution to the fine delay signal $S_{OUT}$ at this moment), the control circuit 106 adjusts the first control input CS1 so as to decrease the coarse delay amount $T_{CD2}$ (which has no impact on the fine delay amount $T_{FD}$ at this moment) without changing the coarse delay amount $T_{CD1}$ (which totally dominates the fine delay amount $T_{FD}$ at this moment). In accordance with adjustment made to the first control input CS1, the coarse delay amount $T_{CD1}$ is maintained at three unit coarse delays, while the coarse delay amount $T_{CD2}$ is changed from four unit coarse delays to two unit coarse delays.

Figure 10A:
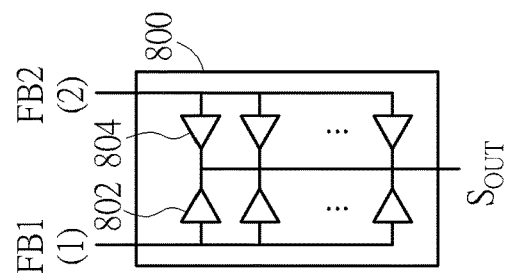
FIG. 10A-FIG. 10E are diagrams illustrating an operation status of a fine delay circuit (e.g., a phase interpolator) at the time the first control input is adjusted according to an embodiment of the present invention.
Figure 10B:
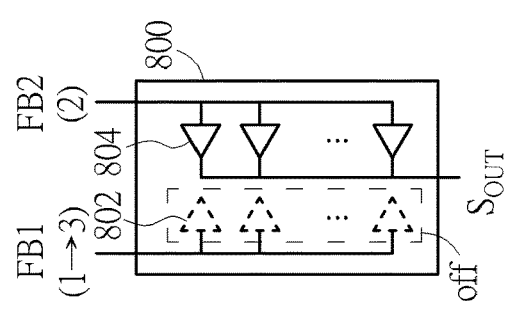

FIG. 10A-FIG. 10E are diagrams illustrating an operation status of the fine delay circuit 104 (e.g., phase interpolator 800) at the time the first control input CS1 is adjusted according to an embodiment of the present invention. Suppose that an initial setting of the first control input CS1 controls the coarse delay amount $T_{CD1}$ to be set by one unit coarse delay (denoted by "1") and controls the coarse delay amount $T_{CD2}$ to be set by two unit coarse delays (denoted by "2"), as illustrated in FIG. 10A. In this embodiment, a target delay amount for setting the fine delay signal $S_{OUT}$ is between five unit coarse delays and six unit coarse delays. Hence, the first control input CS1 and the second control input CS2 should be changed by the control circuit 106 to make the fine delay amount $T_{FD}$ monotonically increased to approach the target delay amount. Since the target delay amount is larger than the coarse delay amount $T_{CD2}$ ($T_{CD2}$=2 & $T_{CD2}$>$T_{CD1}$), the control circuit 106 adjusts the second control input CS2 to reduce the weighting of the coarse delay signal FB1. When the second control input CS2 controls that the fine delay amount TD is totally dominated by the coarse delay amount $T_{CD2}$ (i.e., all buffers 804 are enabled and all buffers 802 are disabled), the control circuit 106 adjusts the first control input CS1 so as to increase the coarse delay amount $T_{CD1}$ from one unit coarse delay to three unit coarse delays, as illustrated in FIG. 10B. Since all buffers 802 are disabled at this moment, changing the coarse delay amount $T_{CD1}$ applied to the input signal $S_{IN}$ can adjust the coarse delay signal FB1 without introducing glitch to the coarse delay signal FB2 that totally dominates the fine delay signal $S_{OUT}$. In this way, a glitch free fine delay signal $S_{OUT}$ is retained.

Figure 10C:
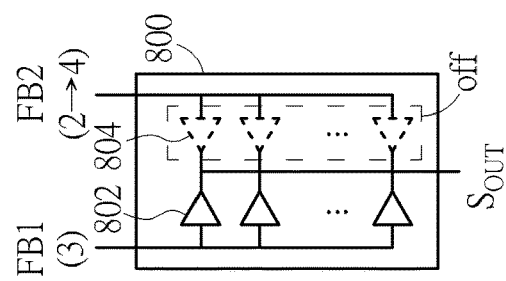

Since the target delay amount is still larger than the coarse delay amount $T_{CD1}$ ($T_{CD1}$=3 & $T_{CD1}$>$T_{CD2}$), the control circuit 106 adjusts the second control input CS2 to reduce the weighting of the coarse delay signal FB2. When the second control input CS2 controls that the fine delay amount TD is totally dominated by the coarse delay amount $T_{CD1}$ (i.e., all buffers 802 are enabled and all buffers 804 are disabled), the control circuit 106 adjusts the first control input CS1 so as to increase the coarse delay amount $T_{CD2}$ from two unit coarse delays to four unit coarse delays, as illustrated in FIG. 10C. Since all buffers 804 are disabled at this moment, changing the coarse delay amount $T_{CD2}$ applied to the input signal $S_{IN}$ can adjust the coarse delay signal FB2 without introducing glitch to the coarse delay signal FB1 that totally dominates the fine delay signal $S_{OUT}$. In this way, a glitch free fine delay signal Sour is retained.

Figure 10D:
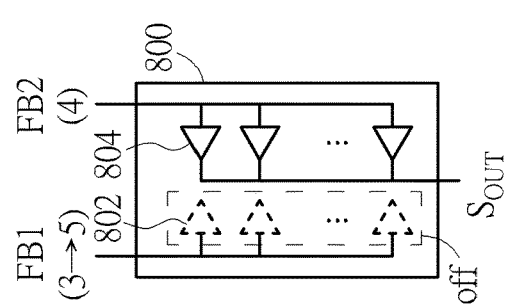

Since the target delay amount is still larger than the coarse delay amount $T_{CD2}$ ($T_{CD2}$=4 & $T_{CD2}$>$T_{CD1}$), the control circuit 106 adjusts the second control input CS2 to reduce the weighting of the coarse delay signal FB1. When the second control input CS2 controls that the fine delay amount TD is totally dominated by the coarse delay amount $T_{CD2}$ (i.e., all buffers 804 are enabled and all buffers 802 are disabled), the control circuit 106 adjusts the first control input CS1 so as to increase the coarse delay amount $T_{CD1}$ from three unit coarse delays to five unit coarse delays, as illustrated in FIG. 10D. Since all buffers 802 are disabled at this moment, changing the coarse delay amount $T_{CD1}$ applied to the input signal $S_{IN}$ can adjust the coarse delay signal FB1 without introducing glitch to the coarse delay signal FB2 that totally dominates the fine delay signal $S_{OUT}$. In this way, a glitch free fine delay signal $S_{OUT}$ is retained.

Figure 10E:
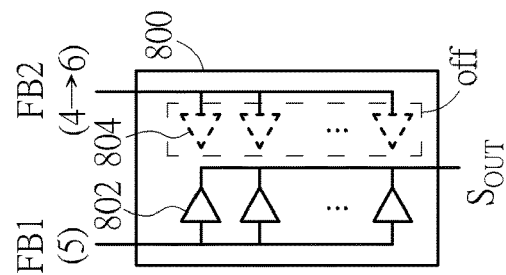

Since the target delay amount is still larger than the coarse delay amount $T_{CD1}$ ($T_{CD1}$=5 & $T_{CD1}$>$T_{CD2}$), the control circuit 106 adjusts the second control input CS2 to reduce the weighting of the coarse delay signal FB2. When the second control input CS2 controls that the fine delay amount $T_{FD}$ is totally dominated by the coarse delay amount $T_{CD1}$ (i.e., all buffers 802 are enabled and all buffers 804 are disabled), the control circuit 106 adjusts the first control input CS1 so as to increase the coarse delay amount $T_{CD2}$ from four unit coarse delays to six unit coarse delays, as illustrated in FIG. 10E. Since all buffers 802 are disabled at this moment, changing the coarse delay amount $T_{CD2}$ applied to the input signal $S_{IN}$ can adjust the coarse delay signal FB2 without introducing glitch to the coarse delay signal FB2 that totally dominates the fine delay signal $S_{OUT}$. In this way, a glitch free fine delay signal $S_{OUT}$ is retained.

Since the target delay amount for setting the fine delay signal $S_{OUT}$ is between five unit coarse delays and six unit coarse delays, the second control input CS2 can be properly set to make the fine delay amount $T_{FD}$ equal to the target delay amount such that the fine delay signal $S_{OUT}$ having the target delay amount $T_{FD}$ with respect to the input signal $S_{IN}$ can be provided from the phase interpolator 800 by phase interpolation performed upon the coarse delay signal FB1 (which has five unit coarse delays with respect to the input signal $S_{IN}$) and the coarse delay signal FB2 (which has six unit coarse delays with respect to the input signal $S_{IN}$).

Figure 11:
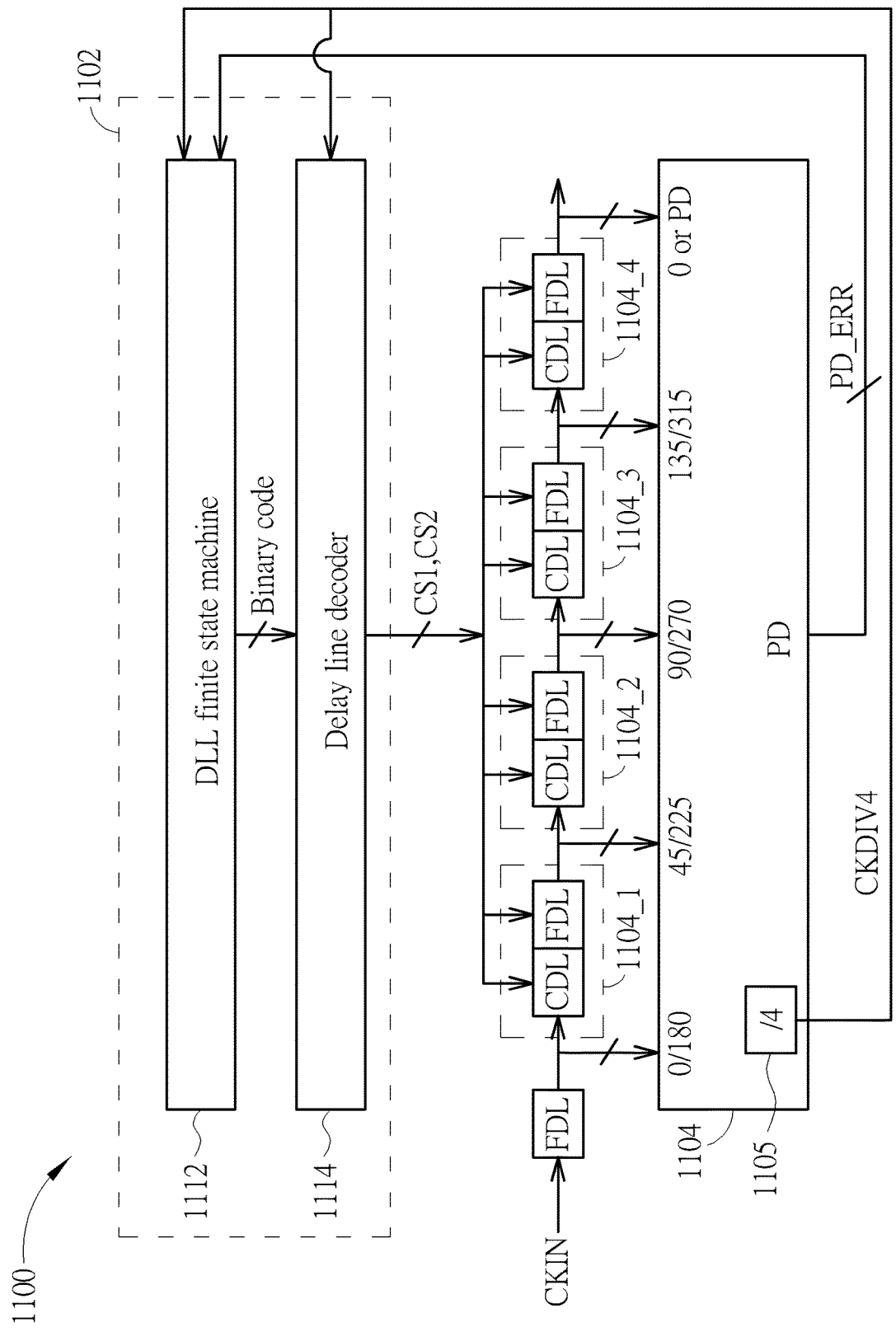
FIG. 11 is a diagram illustrating a delay-locked loop application using proposed glitch free digitally controlled delay lines according to an embodiment of the present invention.

The proposed delay signal generation structure using a glitch free DCDL can be applied to a variety of applications, such as a delay-locked loop (DLL), a phase shifter, etc. FIG. 11 is a diagram illustrating a DLL application using proposed glitch free DCDLs according to an embodiment of the present invention. The DLL 1100 may be a multi-phase clock generator for generating a plurality of output clocks having the same frequency but different phases. In this example, the DLL 1100 has a control circuit 1102, a plurality of glitch free DCDLs 1104_1, 1104_2, 1104_3, 1104_4, and a phase detector (PD) 1104. The control circuit 1102 includes a DLL finite state machine 1112 and a delay line decoder 1114. The PD 1104 performs multi-phase detection to generate a phase error detection result PD_ERR to the DLL finite state machine 1112. In addition, the PD 1104 has a frequency divider (e.g., divide-by-4 circuit) 1105 used for generating a frequency-divided clock CKDIV4 according to an input clock signal of the PD 1104, where the frequency-divided clock CKDIV4 may serve as an operating clock of the DLL finite state machine 1112 and the delay line decoder 1114. The DLL finite state machine 1112 refers to the phase error detection result PD_ERR to decide a binary code. The delay line decoder 1114 decodes the binary code to generate proper control inputs CS1, CS2 to coarse delay circuit (denoted by "CDL") and fine delay circuit (denoted by "FDL") of each glitch free DCDL. In this way, output clocks with different phases can be generated by delaying an input clock CKIN through the glitch free DCDLs 1104_1-1104_4.

Figure 12:
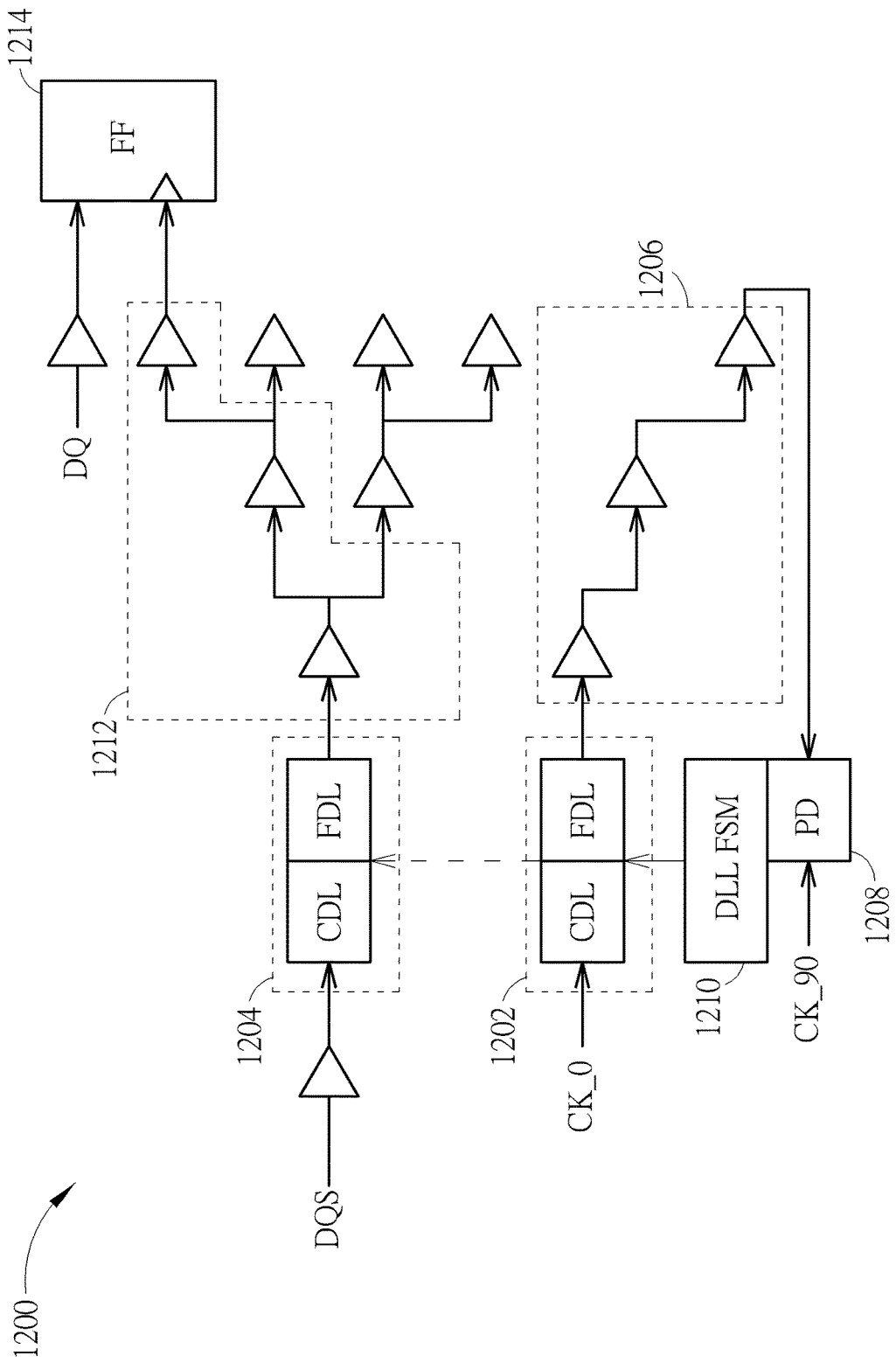
FIG. 12 is a diagram illustrating a memory interface application using proposed glitch free digitally controlled delay lines according to an embodiment of the present invention.

FIG. 12 is a diagram illustrating a memory interface application using proposed glitch free DCDLs according to an embodiment of the present invention. The memory interface 1200 may be a double data rate (DDR) memory interface. In this embodiment, the memory interface 1200 includes a master DCDL 1202 and at least one slave DCDL 1204, each implemented using a proposed glitch free DCDL. A reference clock CK_0 is fed into the master DCDL 1202, such that a delay clock is generated from coarse delay circuit (denoted by "CDL") and fine delay circuit (denoted by "FDL") of the master DCDL 1202. The delay clock generated from the master DCDL 1202 is delivered to a phase detector (PD) 1208 via a clock path 1206 that is replica of a data strobe (DQS) clock tree synthesis (CTS) design. The PD 1208 detects a phase error between a reference clock CK_90 and the delay clock received from the clock path 1206, and outputs a phase error detection result to a delay-locked loop finite state machine (DLL FSM) 1210 which is a control circuit of the master DCDL 1202 as well as the slave DCDL 1204. The reference clocks CK_0 and CK_90 have the same frequency but difference phases. Specifically, the reference clocks CK_0 and CK_90 have a 90-degree phase difference. The DLL FSM 1210 adjusts the control setting of the master DCDL 1202 according to the phase error detection result. The delay amount of the master DCDL 1202 is properly controlled by the DLL FSM 1210 to make a delay clock aligned with the reference clock CK_90 after passing through the clock path 1206. The control setting applied to the master DCDL 1202 is also supplied to the slave DCDL 1204. A DQS signal is fed into the slave DCDL 1202, and a delay signal generated from the slave DCDL 1204 is delivered to a clock input port of a flip flop (FF) 1214 via a clock path 1212 having the DQS CTS. Since the same delay amount calibrated by the master DCDL 1202 is applied to the DQS signal by the slave DCDL 1204, a data (DQ) signal fed into a data input port of the FF 1214 can be sampled at the correct timing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay signal generating apparatus comprising:
a digitally controlled delay line, comprising:
a coarse delay circuit, arranged to generate a plurality of coarse delay signals by applying a plurality of different coarse delay amounts to an input signal, respectively, wherein the different coarse delay amounts are set by a first control input; and
a fine delay circuit, arranged to generate a fine delay signal having a fine delay amount with respect to the input signal by performing phase interpolation based on the coarse delay signals, wherein the fine delay amount is set by a second control input; and
a control circuit, arranged to generate the first control input to the coarse delay circuit and generate the second control input to the fine delay circuit, wherein timing of changing the first control input is constrained by the control circuit, and the control circuit does not change the first control input unless the second control input controls the fine delay circuit to isolate one of the coarse delay signals from the fine delay signal.

2. The delay signal generating apparatus of claim 1, wherein the control circuit controls the coarse delay circuit to change only one of the different coarse delay amounts at a time.

3. The delay signal generating apparatus of claim 1, wherein when the control circuit changes the first control input, said one of the coarse delay signals is adjusted in response to the changed first control input.

4. The delay signal generating apparatus of claim 3, wherein when the control circuit changes the first control input, all of the coarse delay signals except said one of the coarse delay signals remain unchanged.

5. The delay signal generating apparatus of claim 3, wherein said one of the coarse delay signals is adjusted without introducing glitch to a rest of the coarse delay signals.

6. The delay signal generating apparatus of claim 1, wherein the different coarse delay amounts include a first coarse delay amount and a second coarse delay amount; before the first control input is changed by the control circuit, the first coarse delay amount is larger than the second coarse delay amount by a first delay difference; and after the first control input is changed by the control circuit, the second coarse delay amount is larger than the first coarse delay amount by a second delay difference.

7. The delay signal generating apparatus of claim 6, wherein the first delay difference is equal to the second delay difference.

8. The delay signal generating apparatus of claim 1, wherein the different coarse delay amounts include a first coarse delay amount and a second coarse delay amount; the coarse delay circuit comprises a plurality of delay elements; the first coarse delay amount is set by at least one first delay element selected from the delay elements; the second coarse delay amount is set by a plurality of second delay elements selected from the delay elements; and the at least one first delay element and the second delay elements have at least one common delay element.

9. The delay signal generating apparatus of claim 1, wherein the different coarse delay amounts include a first coarse delay amount and a second coarse delay amount; the coarse delay circuit comprises common delay elements, a first group of delay elements located on a first side of the common delay elements, and a second group of delay elements located on a second side of the common delay elements; when the first control input has a first setting, at least one delay element selected from the first group of delay elements is involved in setting the first coarse delay amount, and at least one delay element selected from the second group of delay elements is involved in setting the second coarse delay amount; and when the first control input has a second setting, at least one delay element selected from the second group of delay elements is involved in setting the first coarse delay amount, and at least one delay element selected from the first group of delay elements is involved in setting the second coarse delay amount.

10. The delay signal generating apparatus of claim 1, wherein the coarse delay circuit comprises a plurality of delay elements; the different coarse delay amounts include at least one coarse delay amount resulting from interpolation of different delay amounts provided by delay elements that are selected from the delay elements and form different delay paths.

11. A delay signal generating method comprising:
generating a first control input;
generating a second control input;
generating a plurality of coarse delay signals by applying a plurality of different coarse delay amounts to an input signal, respectively, wherein the different coarse delay amounts are digitally controlled by the first control input; and
generating a fine delay signal with a fine delay amount by performing phase interpolation based on the coarse delay signals, wherein the fine delay amount is digitally controlled by the second control input;
wherein timing of changing the first control input is constrained, and the first control input is not changed unless the second control input controls the phase interpolation to isolate one of the coarse delay signals from the fine delay signal.

12. The delay signal generating method of claim 11, wherein generating the first control input comprises:
adjusting the first control input, such that only one of the different coarse delay amounts is changed at a time.

13. The delay signal generating method of claim 11, wherein when the first control input is changed, said one of the coarse delay signals is adjusted in response to the changed first control input.

14. The delay signal generating method of claim 13, wherein when the first control input is changed, all of the coarse delay signals except said one of the coarse delay signals remain unchanged.

15. The delay signal generating method of claim 13, wherein said one of the coarse delay signals is adjusted without introducing glitch to a rest of the coarse delay signals.

16. The delay signal generating method of claim 11, wherein the different coarse delay amounts include a first coarse delay amount and a second coarse delay amount; before the first control input is changed, the first coarse delay amount is larger than the second coarse delay amount by a first delay difference; and after the first control input is changed, the second coarse delay amount is larger than the first coarse delay amount by a second delay difference.

17. The delay signal generating method of claim 16, wherein the first delay difference is equal to the second delay difference.

18. The delay signal generating method of claim 11, wherein the different coarse delay amounts include a first coarse delay amount and a second coarse delay amount; the first coarse delay amount is set by at least one first delay element; the second coarse delay amount is set by a plurality of second delay elements; and the at least one first delay element and the second delay elements have at least one common delay element.

19. The delay signal generating method of claim 11, wherein the different coarse delay amounts include a first coarse delay amount and a second coarse delay amount; the coarse delay signals are generated from a coarse delay circuit comprising common delay elements, a first group of delay elements located on a first side of the common delay elements, and a second group of delay elements located on a second side of the common delay elements; when the first control input has a first setting, at least one delay element selected from the first group of delay elements is involved in setting the first coarse delay amount, and at least one delay element selected from the second group of delay elements is involved in setting the second coarse delay amount; and when the first control input has a second setting, at least one delay element selected from the second group of delay elements is involved in setting the first coarse delay amount, and at least one delay element selected from the first group of delay elements is involved in setting the second coarse delay amount.

20. The delay signal generating method of claim 11, wherein the different coarse delay amounts include at least one coarse delay amount resulting from interpolation of different delay amounts provided by delay elements located at different paths.

* * * * *